(12) United States Patent
Fujii

(10) Patent No.: US 7,944,049 B2
(45) Date of Patent: May 17, 2011

(54) SEMICONDUCTOR DEVICE AND MANUFACTURING METHOD THEREOF

(75) Inventor: Seiya Fujii, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/398,049

(22) Filed: Mar. 4, 2009

(65) Prior Publication Data
US 2009/0224401 A1 Sep. 10, 2009

(30) Foreign Application Priority Data
Mar. 4, 2008 (JP) .................... 2008-054155

(51) Int. Cl.
*H01L 23/48* (2006.01)
*H01L 29/40* (2006.01)

(52) U.S. Cl. ........ 257/737; 257/686; 257/723; 257/777; 438/109

(58) Field of Classification Search .................. 257/737, 257/686, 723, 777, E23.068, E21.499; 438/109
See application file for complete search history.

(56) References Cited

U.S. PATENT DOCUMENTS
7,692,295 B2 * 4/2010 Megahed ................. 257/728
2002/0140073 A1 * 10/2002 Pai et al. ................. 257/686

FOREIGN PATENT DOCUMENTS
JP 9-162531 A 6/1997
JP 11-307564 A 11/1999
JP 2001-210749 A 8/2001

* cited by examiner

*Primary Examiner* — Theresa T Doan
(74) *Attorney, Agent, or Firm* — Sughrue Mion, PLLC

(57) ABSTRACT

A semiconductor device comprises a package substrate, a semiconductor chip, a plurality of bump electrodes and one or more dummy chips. The semiconductor chip is mounted on one surface of the package substrate. The bump electrodes are the other surface of the package substrate and electrically connected to the semiconductor chip through a wiring structure. Each of the dummy chips is mounted on a predetermined region close to a corner portion of the semiconductor chip on the one surface of the package substrate.

In the semiconductor chip, the dummy chips are formed of material having the same or similar coefficient of thermal expansion as that of the semiconductor chip. Therefore the stress caused by a difference between coefficients of thermal expansion is suppressed so as to improve connection reliability.

20 Claims, 11 Drawing Sheets

SEMICONDUCTOR DEVICE AND MANUFACTURING METHOD THEREOF

BACKGROUND OF THE INVENTION

1. Field of the Invention

The present invention relates to a semiconductor device having a semiconductor chip mounted on a package substrate, and particularly relates to a semiconductor device having a structure for improving connection reliability of bump electrodes formed on a back surface of the package substrate, and manufacturing method thereof.

2. Description of Related Art

Semiconductor devices have been conventionally used in which a large number of bump electrodes are formed on a back surface of a package substrate and a semiconductor chip is mounted on the package substrate. Such semiconductor devices particularly have a problem of fracture of bump electrodes located in the vicinity of an outer portion of the semiconductor chip among the bump electrodes on the package substrate. Generally, in the semiconductor chip, a difference between coefficients of thermal expansion is larger than that of the package substrate or resin, and therefore some of the bump electrodes are prone to damage due to stress induced at a boundary portion of the semiconductor chip. Particularly, since the coefficients of thermal expansion largely differ between a portion where the semiconductor chip exists and a portion where the semiconductor chip does not exist, the damage to the bump electrodes increases in regions close to corner portions of the semiconductor chip relative to other regions. Accordingly, in order to improve mounting reliability of the semiconductor device, measures to suppress the damage to the bump electrodes in the vicinity of the corner portions of the semiconductor chip are desired.

Various methods have been conventionally proposed to improve connection strength of the bump electrodes in semiconductor devices. For example, a method for improving the connection strength by forming bump electrodes of large size in corner portions of a dielectric substrate (for example, see Patent Reference 1), a method for inducing uniform stress on the bump electrodes by forming the bump electrodes having a curved contour at their outer edges on a substrate (for example, see Patent Reference 2), and a method for preventing the fracture due to stress concentration on certain bump electrodes by arranging the bump electrodes in a concentric manner on the package substrate (for example, see Patent Reference 3) have been proposed.

Patent Reference 1: Laid-open Japanese Patent Publication No. 2001-210749
Patent Reference 2: Laid-open Japanese Patent Publication No. Hei 9-162531
Patent Reference 3: Laid-open Japanese Patent Publication No. Hei 11-307564

However, according to the above conventional methods, the effect to prevent the fracture due to the stress concentration on the bump electrodes is restrictive, and is insufficient for improving the connection reliability of the bump electrodes. That is, the above conventional methods enable to suppress the stress concentration on the bump electrodes in peripheral portions including the corner portions of the package substrate, however it has been discovered that the fracture due to the stress concentration on the bump electrodes is actually prone to occur mainly at the bump electrodes immediately under corner portions of the semiconductor chip, instead of corner portions of the package substrate.

Problems related to the above connection reliability will be described with reference to FIGS. 10, 11A and 11B. As shown in FIG. 10, a plurality of bump electrodes 101 arranged in a matrix form is formed on a back surface of a package substrate 100, and positions overlapping an outline of a semiconductor chip 102 mounted on an opposite surface are shown with a dotted line. Among the plurality of bump electrodes 101 shown in FIG. 10, four bump electrodes 101a located immediately under corner portions of the semiconductor chip 102 are especially prone to fracture due to stress. FIGS. 11A and 11B are diagrams schematically showing behaviors of a semiconductor device including the package substrate 100 under temperature fluctuation. A semiconductor chip 102 mounted on a central region of the top surface of the package substrate 100 is electrically connected to the bump electrodes 101 through wires 103, a wiring structure (not shown) of the package substrate 100 and lands 104 respectively in this order.

The semiconductor chip 102 has a coefficient of thermal expansion which is smaller than that of the package substrate 100 or upper resin 105. Thus, in FIGS. 11A and 11B, a region R1 in which the semiconductor chip 102 is arranged is difficult to expand due to the temperature fluctuation. On the other hand, a region R2 in which the semiconductor chip 102 is not arranged is relatively prone to expand due to the temperature fluctuation. Accordingly, under the temperature fluctuation, stress occurs due to expansion and contraction of the regions R1 and R2, and there appear two cases, one of which is an upward concave deformation as shown in FIG. 11A, and the other of which is an upward convex deformation as shown in FIG. 11B. In these cases, bump electrodes 101a formed immediately under a boundary between the regions R1 and R2 is a base point of the expansion and contraction of the package substrate 100, and therefore is directly affected by the stress. Particularly, the bump electrodes 101a immediately under the corner portions of the semiconductor chip 102 are prone to fracture due to the stress.

Since the above conventional methods do not focus attention on whether or not the semiconductor chip 102 exists, the damage to the bump electrodes 101a becomes large immediately under the corner portions of the semiconductor chip 102 so that the probability of the fracture inevitably increases. Also, in the above conventional methods, the region where the bump electrodes 101 are not arranged is provided, for example, in a peripheral portion of the package substrate 100, which is a disadvantage in terms of arrangement density of the bump electrodes 101. Since a semiconductor device having multiple pins and narrow pitch has been strongly demanded, it becomes a problem to solve to implement measures without hindering a high density arrangement of a large number of bump electrodes.

SUMMARY

The present invention seeks to solve the above problems and provides a semiconductor device capable of suppressing damage to bump electrodes due to stress caused by a difference between coefficients of thermal expansion of a semiconductor chip and a package substrate so as to improve connection reliability, and provides a manufacturing method thereof.

In one of aspects of the invention, there is provided a semiconductor device comprising: a package substrate; a semiconductor chip mounted on one surface of said package substrate; a plurality of bump electrodes mounted on another surface of said package substrate and electrically connected to said semiconductor chip through a wiring structure; and one or more dummy chips each mounted on a predetermined region close to a corner portion of said semiconductor chip on the one surface of said package substrate, wherein said dummy chips are formed of material having a same or similar coefficient of thermal expansion as that of said semiconductor chip.

According to the aspects of the invention, the semiconductor chip is mounted on the package substrate and the dummy chips are mounted on regions close to the four corner portions of the semiconductor chip. Thus, the stress induced to the corner portions of the semiconductor chip is decreased since the dummy chips having a small difference between coefficients of thermal expansion are provided near the corner portions, so that damage to the bump electrodes immediately under the corner portions can be suppressed. Accordingly, the fracture of the bump electrodes can be prevented, thereby improving the connection reliability of the package substrate.

In another aspect of the invention, there is provided a manufacturing method of a semiconductor device comprising a package substrate with a wiring structure and a semiconductor chip with a predetermined electronic circuit, the method comprising: mounting said semiconductor chip on a central region of one surface of said package substrate; mounting one or more dummy chips formed of material having a same or similar coefficient of thermal expansion as that of said semiconductor chip on one or more predetermined regions close to one or more corner portions of said semiconductor chip on the one surface of said package substrate; and forming a plurality of bump electrodes connected to said semiconductor chip through the wiring structure on another surface of said package substrate.

As described above, according to the present invention, the semiconductor chip and the dummy chips are mounted on one surface of the package substrate, the plurality of bump electrodes are mounted on the other surface of the package substrate, and the difference between the coefficients of thermal expansion can be sufficiently small. Therefore, the stress caused by the difference between the coefficients of thermal expansion can be decreased in regions where the dummy chips are close to the corner portions of the semiconductor chip. Thus, at the bump electrodes under these regions, the damage due to the stress can be suppressed so that the fracture of the bump electrodes can be prevented so as to improve connection reliability of the package substrate. Further, since the mounting of the dummy chips does not affect the arrangement of the plurality of bump electrodes, thereby arranging the bump electrodes in a high density without hindering multi pins and narrow pitch of the semiconductor device.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, five embodiments of a semiconductor device to which the present invention is applied will be described.

First Embodiment

Figure 1:
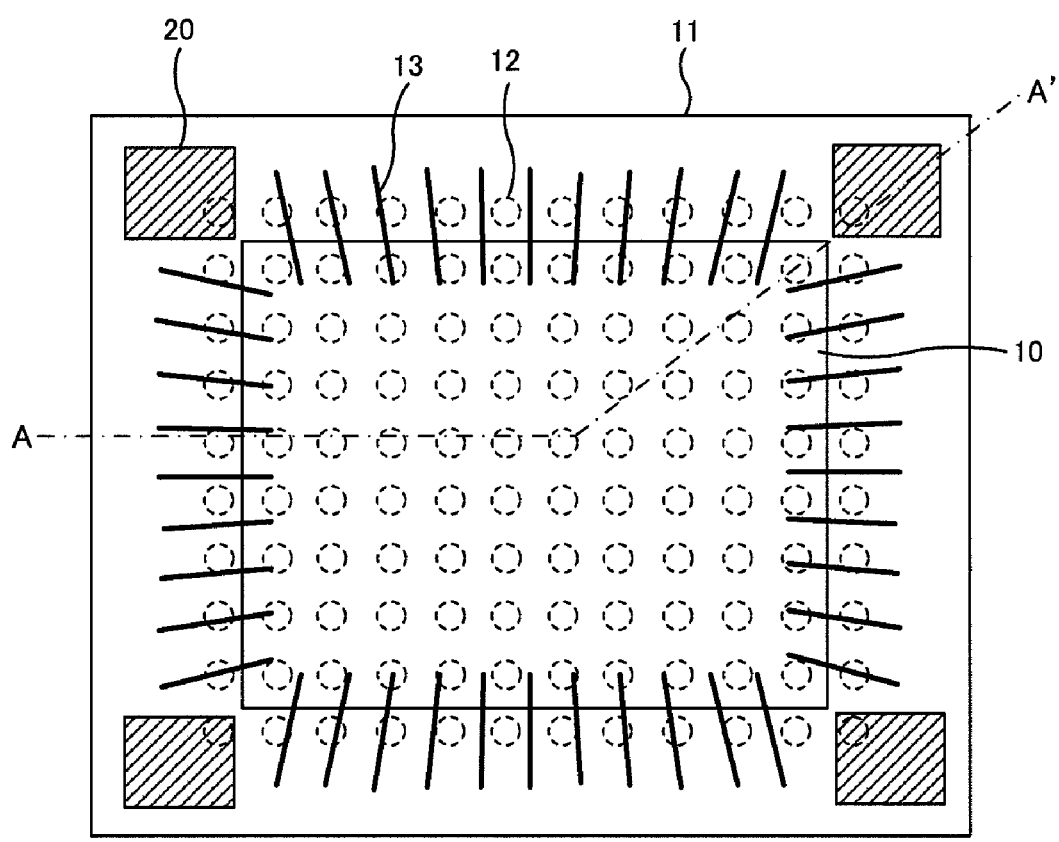
FIG. 1 is a plan view of a semiconductor device of a first embodiment.
Figure 2:
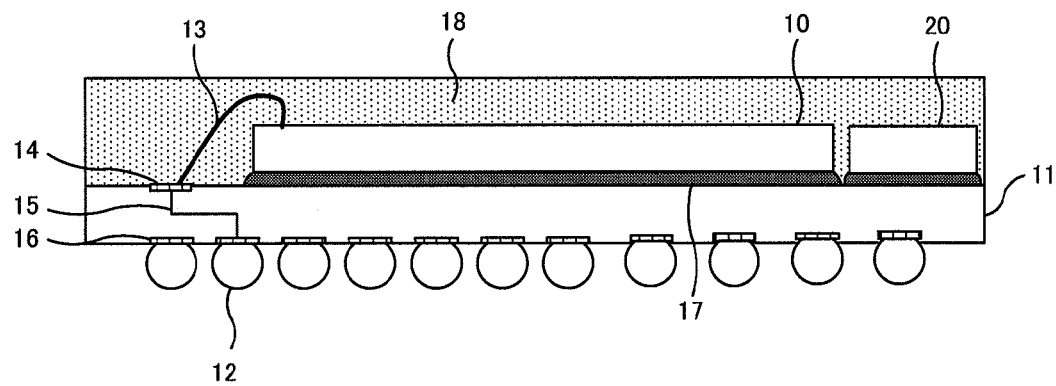
FIG. 2 is a cross-sectional view along a line A-A' in FIG. 1.

A semiconductor device of a first embodiment will be described with reference to FIGS. 1 to 4. Regarding a structure of the semiconductor device of the first embodiment, FIG. 1 shows a plan view and FIG. 2 shows a cross-sectional view along a line A-A' in FIG. 1. The semiconductor device of the first embodiment has a structure in which a semiconductor chip 10 with a predetermined electronic circuit is mounted on a central region of a top surface of a package substrate 11. The package substrate 11 is formed in a rectangle larger than the size of the semiconductor chip 10, and four dummy chips 20 whose size is smaller than the semiconductor chip 10 are mounted at positions close to four corner portions around the semiconductor chip 10 in a peripheral region of the top surface of the package substrate 11. The function of these dummy chips 20 will be described later. A plurality of bump electrodes 12 for connection with an external circuit board are formed in a matrix arrangement on a back surface of the package substrate 11.

A large number of pads (not shown) are formed on the top surface of the semiconductor chip 10, and each of the pads is connected to a connection pad 14 formed on the top surface of the package substrate 11 through a wire 13. As shown in FIG. 2, each connection pad 14 is connected to a land 16 formed on the back surface of the package substrate 11 through a wiring 15 formed inside the package substrate 11. Each land 16 is connected to the bump electrode 12 formed in a ball shape. The semiconductor chip 10 and the dummy chips 20 are entirely sealed with insulating resin 18 in a state where the chips are fixed to the package substrate 11 by adhesive 17.

The package substrate 11 is formed of, for example, glass epoxy and has a relatively large coefficient of thermal expansion. Meanwhile, the semiconductor chip 10 is formed of a silicon substrate and has a smaller coefficient of thermal expansion than that of the package substrate 11. If the dummy chips 20 are not arranged around the semiconductor chip 10, stress occurs due to a difference between the coefficients of thermal expansion of the package substrate 11 and the semiconductor chip 10, and bump electrodes 12 immediately under the corner portions of the semiconductor chip 10 are prone to fracture. As measures against such fracture of the bump electrodes 12, the first embodiment employs a structure in which the dummy chips 20 are arranged in regions close to the respective corner portions of the semiconductor chip 10, in the peripheral region of the top surface of the package substrate 11.

The dummy chip 20 is desired to be formed of a silicon substrate so as to have the same coefficient of thermal expansion as the semiconductor chip 10. Otherwise, the dummy chip 20 may be formed using other substrate materials of which the difference of the coefficients of thermal expansion is small relative to the semiconductor chip 10. Further, the thickness of the dummy chip 20 is desired to be approximately the same as the semiconductor chip 10. In the first embodiment, since the dummy chips 20 are arranged close to the corner portions of the semiconductor chip 10, the stress caused by the difference between the coefficients of thermal expansion is reduced at these portions. Accordingly, it is possible to suppress the damage to the bump electrodes 12 immediately under the corner portions of the semiconductor chip 10 so that connection reliability of the package substrate 11 is improved.

Figure 3A:
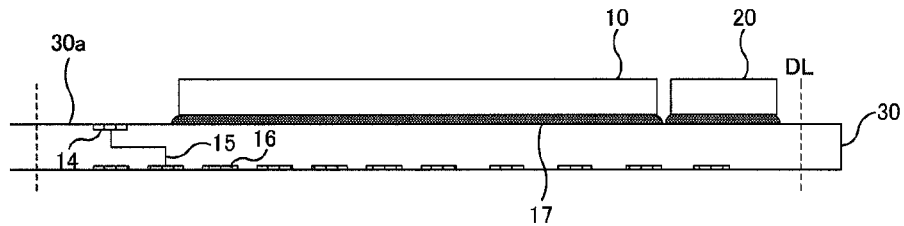
FIGS. 3A to 3E are cross-sectional views of the semiconductor device of the first embodiment in a manufacturing process thereof.
Figure 3B:
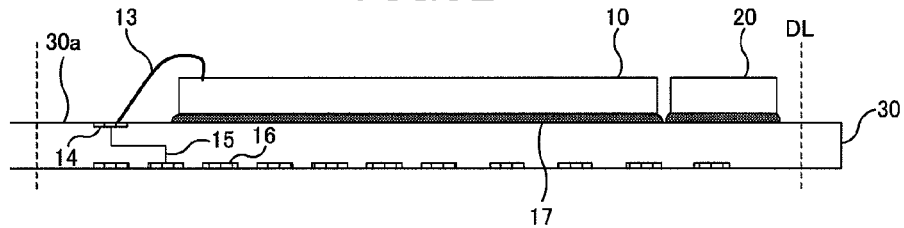
Figure 3C:
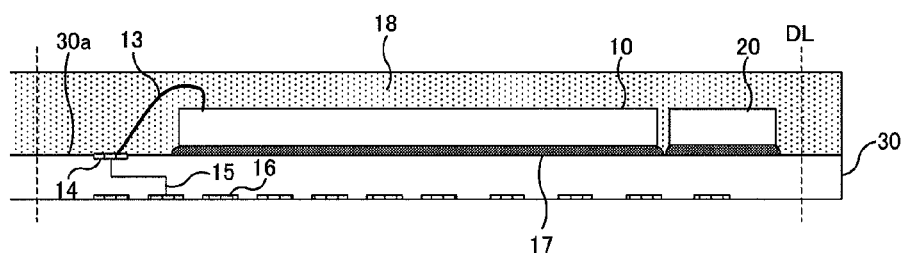
Figure 3D:
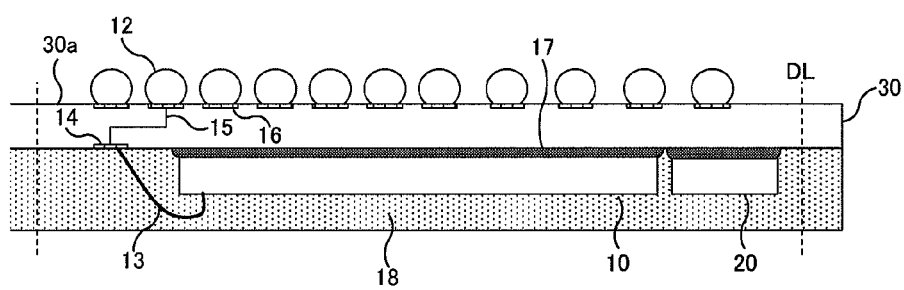
Figure 3E:
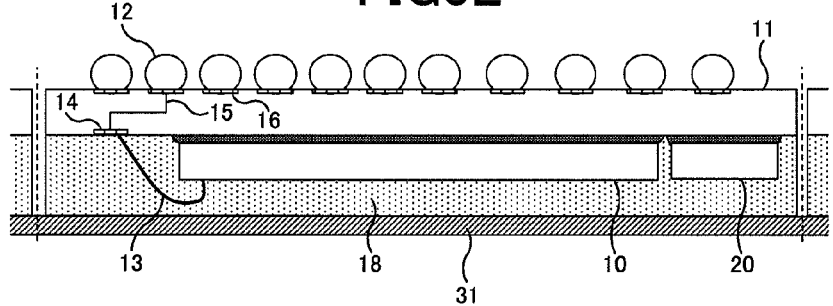
Figure 4:
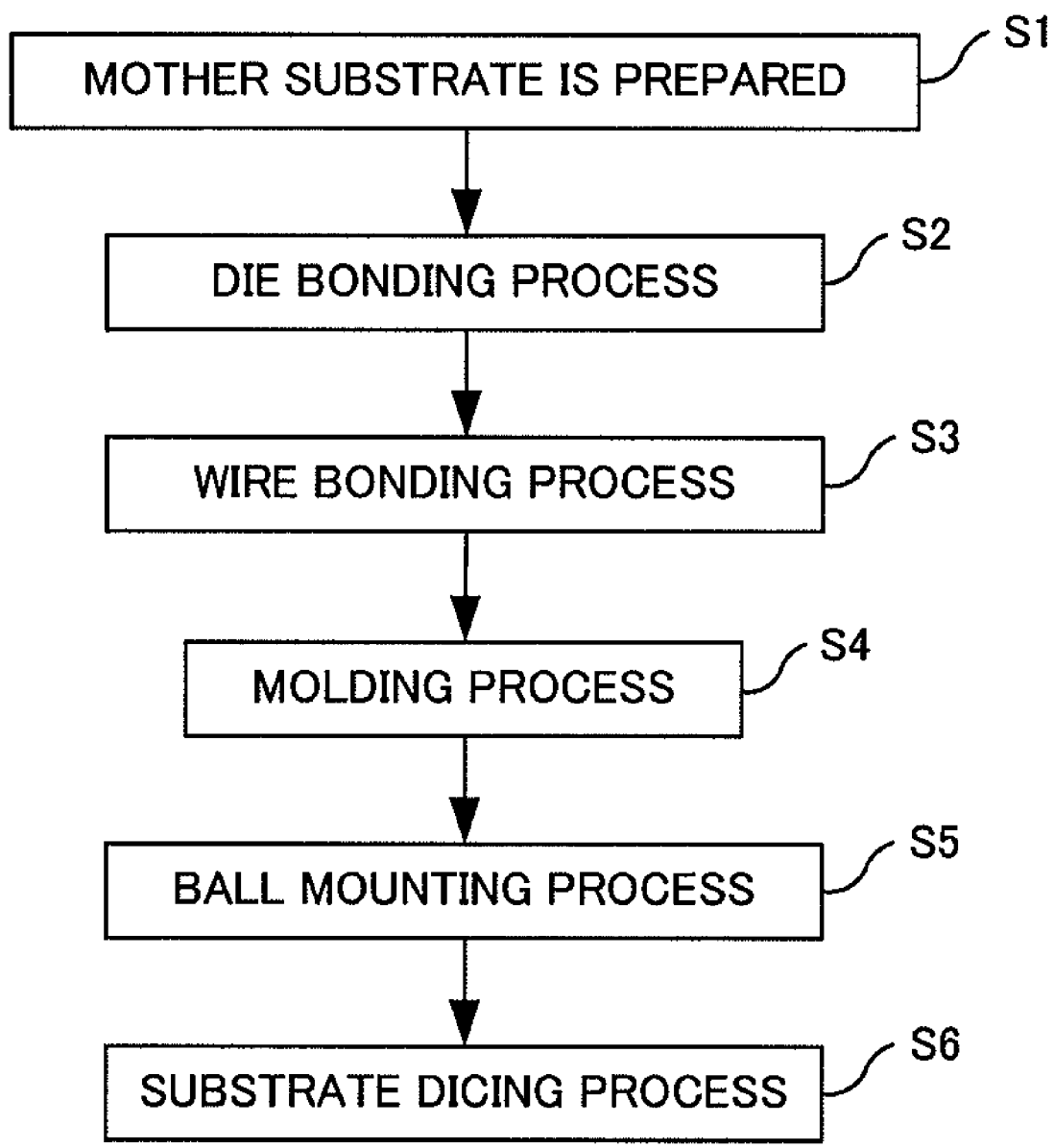
FIG. 4 is a process flow chart showing manufacturing steps of the semiconductor device of the first embodiment.

Next, manufacturing method of the semiconductor device of the first embodiment will be described with reference to FIGS. 3A to 3E and 4. FIGS. 3A to 3E show cross-sectional views of the semiconductor device in a manufacturing process thereof, and FIG. 4 shows a process flow chart showing manufacturing steps (Steps S1 to S6) of the semiconductor device. First, a mother substrate 30a used to form a plurality of package substrates 11 is prepared (Step S1). As shown in FIGS. 3A to 3E, the mother substrate 30 is a wiring substrate made of glass epoxy material and includes a plurality of product forming regions 30a. In the mother substrate 30, the plurality of product forming regions 30a are arranged in a matrix form, and dicing lines DL are set between the respective product forming regions 30a. Then, by cutting the mother substrate 30 along the dicing lines DL, package substrates 11 shown in FIG. 1 are separated from one anther. Each product forming region 30a has the same structure as in FIG. 1, a plurality of connection pads 14 are formed on the top surface on which the semiconductor chip 10 is mounted, and a plurality of lands 16 arranged in a matrix form are formed on the back surface to which a plurality of bump electrodes 12 are connected. Wirings 15 for electrically connecting between the connection pads 14 and the corresponding lands 16 are formed inside the mother substrate 30.

Subsequently, die bonding process is performed for the mother substrate 30 (Step S2). As shown in FIG. 3A, each semiconductor chip 10 is mounted on the center of the product forming regions 30a. The semiconductor chip 10 is fixed to the product forming region 30a via, for example, insulating adhesive 17, using a die bonding device (not shown).

Subsequently, the dummy chips 20 are mounted on regions close to the corner portions of the semiconductor chip 10 (see FIG. 1) on the product forming region 30a. The dummy chips 20 are fixed to the product forming region 30a via the above adhesive 17. As described above, a silicon substrate having the same coefficient of thermal expansion and approximately the same thickness as the semiconductor chip 10 or substrate material capable of obtaining a small difference between the coefficients of thermal expansion relative to the semiconductor chip 10 may be used as the dummy chip 20.

Subsequently, wire bonding process is performed for the mother substrate 30 (Step S3). As shown in FIG. 3B, pads on the semiconductor chip 10 and the connection pads 14 on the product forming region 30a are connected by conductive wires 13 made of, for example, Au. Wire bonding using the wires 13 is performed by a wire bonding apparatus (not shown). Specifically, in a state where each wire 13 is melted and a ball is formed at a top end thereof, the wire 13 and the pad on the semiconductor chip 10 are connected together by ultrasonic thermo-compression bonding. Thereafter, a back end of the wire 13 forming a loop-shape is connected to the connection pad 14 by the ultrasonic thermo-compression bonding so that the wire bonding is completed. Thereby, all pads on the semiconductor chip 10 and predetermined connection pads 14 on the product forming region 30a are connected together by the wires 13.

Subsequently, molding process is performed for the mother substrate 30 for which the above wire bonding process is completed (Step S4). The molding process is performed using a transfer mold apparatus (not shown). Specifically, melted sealing resin is filled into the mother substrate 30 which is in a state of being clamped by an upper mold and a lower mold of the transfer mold apparatus. Then, the mother substrate 30 filled with the sealing resin is cured so that thermally cured sealing resin is obtained. For example, thermal curing epoxy resin is used as the sealing resin. As shown in FIG. 3C, block molding for forming a sealing portion made of the resin 18 which covers the plurality of the product forming regions 30a as a whole is performed. By employing the block molding, the sealing portion can be effectively formed.

Subsequently, ball mounting process is performed for the mother substrate 30 on which the sealing portion (resin 18) is formed (Step S5). In the ball mounting process, solder bumps are placed at positions of the bump electrodes 12 as external terminals respectively on lands 16 formed on the back surface of the mother substrate 30, as shown in FIG. 3D. Vacuum adsorption is performed for the solder bumps using a mounting tool of, for example, a ball mounter (not shown), and thereby the solder bumps are placed on the lands 16 of the wiring substrate via flux. Thereafter, by reflowing the mother substrate 30, the solder bumps are connected to the lands 16 so as to form the bump electrodes 12 as shown in FIG. 3D.

Subsequently, substrate dicing process is performed for the mother substrate 30 on which the bump electrodes 12 are formed (Step S6). In the substrate dicing process, the top surface of the resin 18 is glued and fixed to a dicing tape 31 as shown in FIG. 3E. Then, the dicing lines DL of the mother substrate 30 are grinded using a dicing blade (not shown) rotating at high-speed, and the respective product forming regions 30a are cut and separated from one another. Thereafter, the product forming regions 30a are detached from the dicing tape 31, so that the semiconductor device of FIG. 1 is completed.

Second Embodiment

Figure 5:
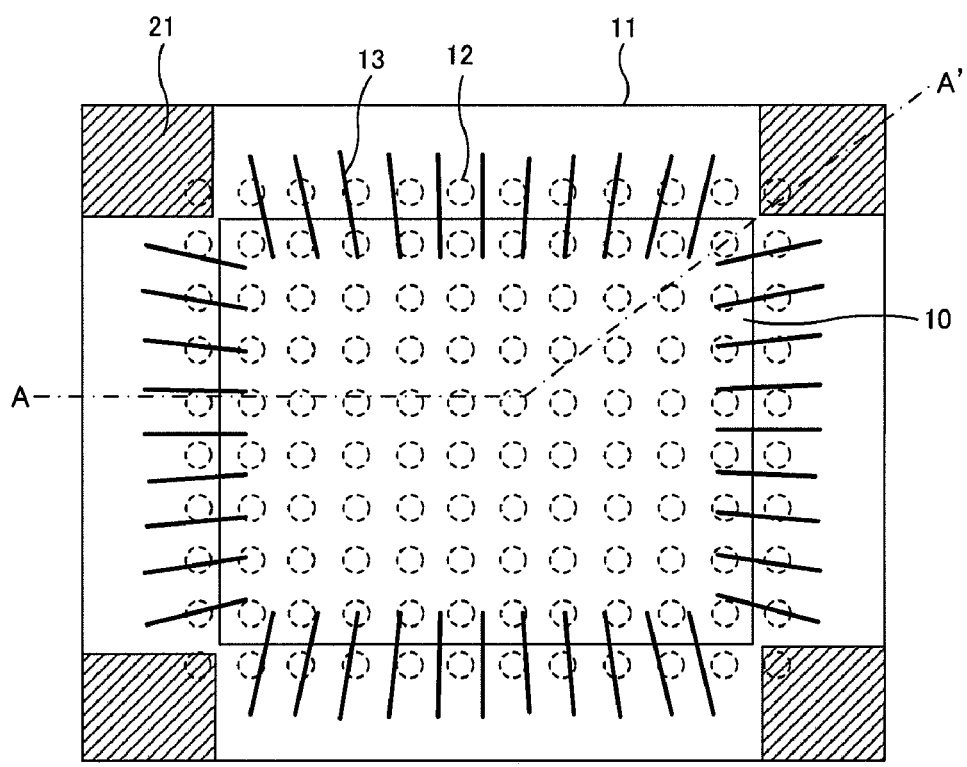
FIG. 5 a plan view of a semiconductor device of a second embodiment.
Figure 6:
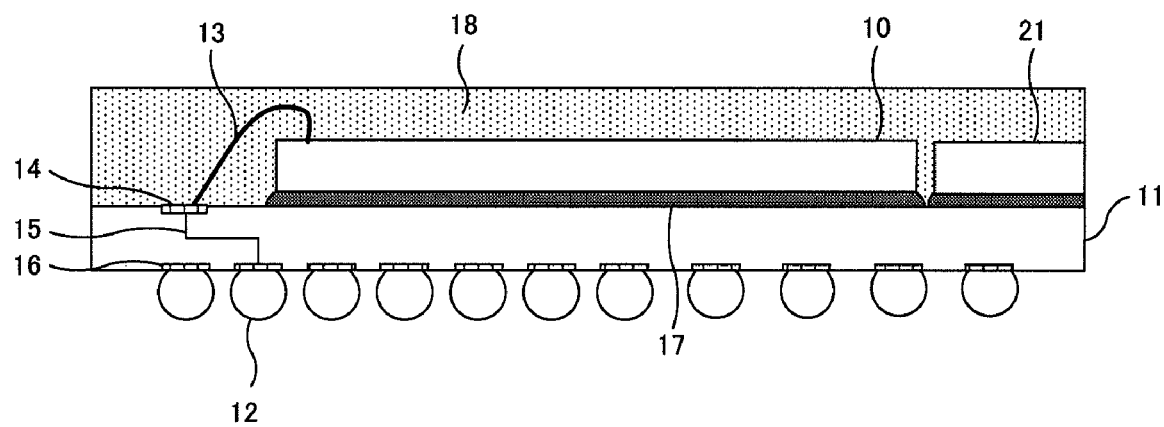
FIG. 6 is a cross-sectional view along a line A-A' in FIG. 5.

Next, a semiconductor device of a second embodiment will be described with reference to FIGS. 5 and 6. Regarding a structure of the semiconductor device of the second embodiment, FIG. 5 shows a plan view and FIG. 6 shows a cross-sectional view along a line A-A' in FIG. 5. In the semiconductor device of the second embodiment, the basic structure including the semiconductor chip 10 and the package substrate 11 is the same as that in the first embodiment. Meanwhile, in the second embodiment, four dummy chips 21 each having a shape different from that of the dummy chip 20 of the first embodiment are arranged in regions close to the four corner portions around the semiconductor chip 10.

Each dummy chip 21 of the second embodiment is formed in a rectangle larger than the size of the dummy chip 20 in FIG. 1. That is, two sides of the dummy chip 21 are located to overlap the two sides of the package substrate 11 as shown in FIG. 5. Further, each dummy chip 21 is mounted so that its side surfaces are located to overlap side surfaces of the package substrate 11 via adhesive 17 as shown in FIG. 6. Here, in the substrate dicing process (Step S6) shown in FIG. 4, the mother substrate 30 is cut together with the dummy chips 21 along the dicing lines DL in a state where each dummy chip 21 is arranged to extend over the product forming regions 30a.

In this manner, by expanding the size of the dummy chips 21, it is possible to suppress the damage to a larger number of the bump electrodes 12 under the dummy chips 21 and their periphery, thereby improving the connection reliability. Further, the number of the dummy chips 21 mounted on the mother substrate 30 can be reduced, thereby improving the manufacturing efficiency. Furthermore, each dummy chip 21 arranged adjacent to the semiconductor chip 10 has side surfaces exposed to the sides of the package substrate 11 as shown in FIG. 6, which contributes to an improvement in radiation performance.

Third Embodiment

Figure 7:
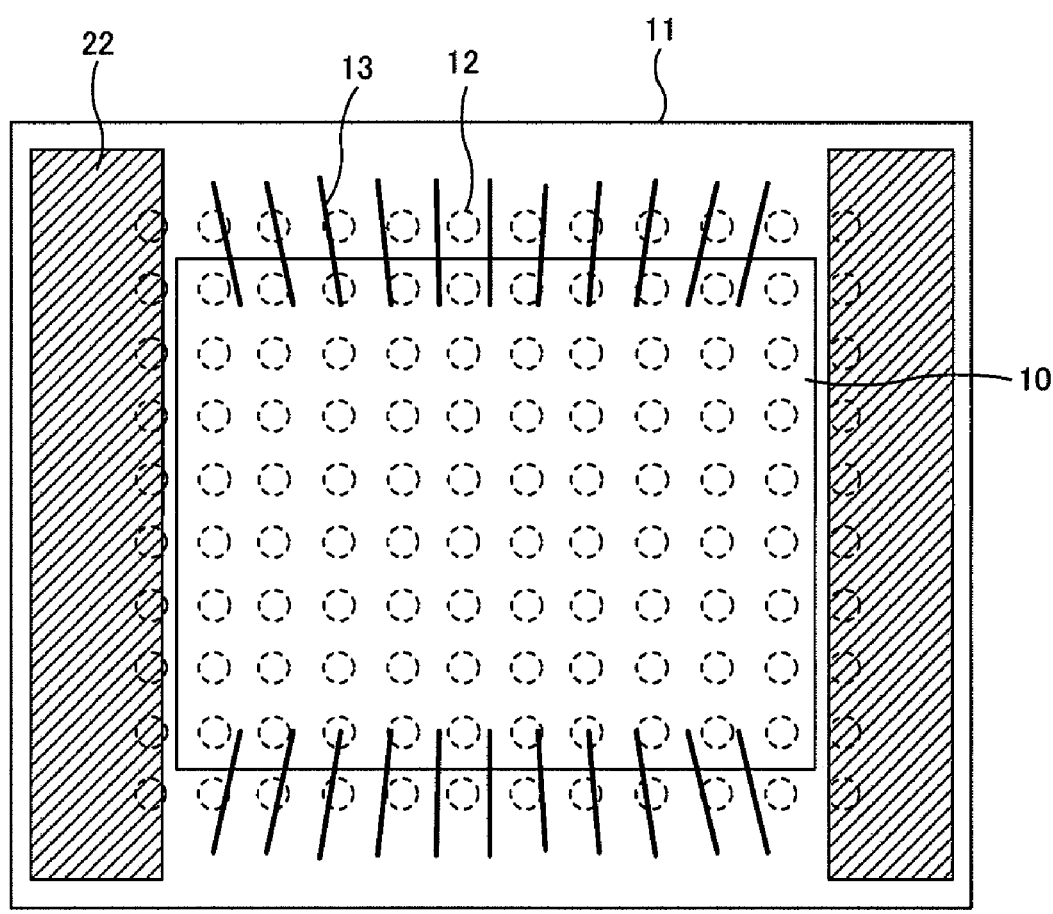
FIG. 7 a plan view of a semiconductor device of a third embodiment.

Next, a semiconductor device of a third embodiment will be described with reference to FIG. 7. FIG. 7 shows a plan view of the semiconductor device of the third embodiment. In the semiconductor device of the third embodiment, the basic structure including the semiconductor chip 10 and the package substrate 11 is the same as that in the first embodiment. Meanwhile, in the third embodiment, two dummy chips 22 are arranged in two regions close to both two adjacent corner portions of the four corner portions around the semiconductor chip 10. In addition, a cross sectional structure of the semiconductor device of the third embodiment can be similarly shown as in FIG. 2.

The dummy chips 22 of the third embodiment are located along opposite two sides of the rectangular package substrate 11. Thus, each dummy chip 22 is formed in a rectangle having two short sides of the same length as that in FIG. 1 and two long sides of a length close to the length of the package substrate 11. Therefore, the wires 13 for connecting between the pads of the semiconductor chip 10 and the connection pads 14 of the package substrate 11 are not provided in regions where the dummy chips 22 are arranged.

In this manner, by arranging the dummy chips 22 in regions close to the two corner portions on both sides of the semiconductor chip 10, the damage to the bump electrodes 12 under the sides along the dummy chips 22 can be suppressed, thereby improving the connection reliability. Further, the number of the dummy chips 22 in the third embodiment can be reduced relative to the dummy chips 20 in the first embodiment, thereby improving the manufacturing efficiency.

Fourth Embodiment

Figure 8:
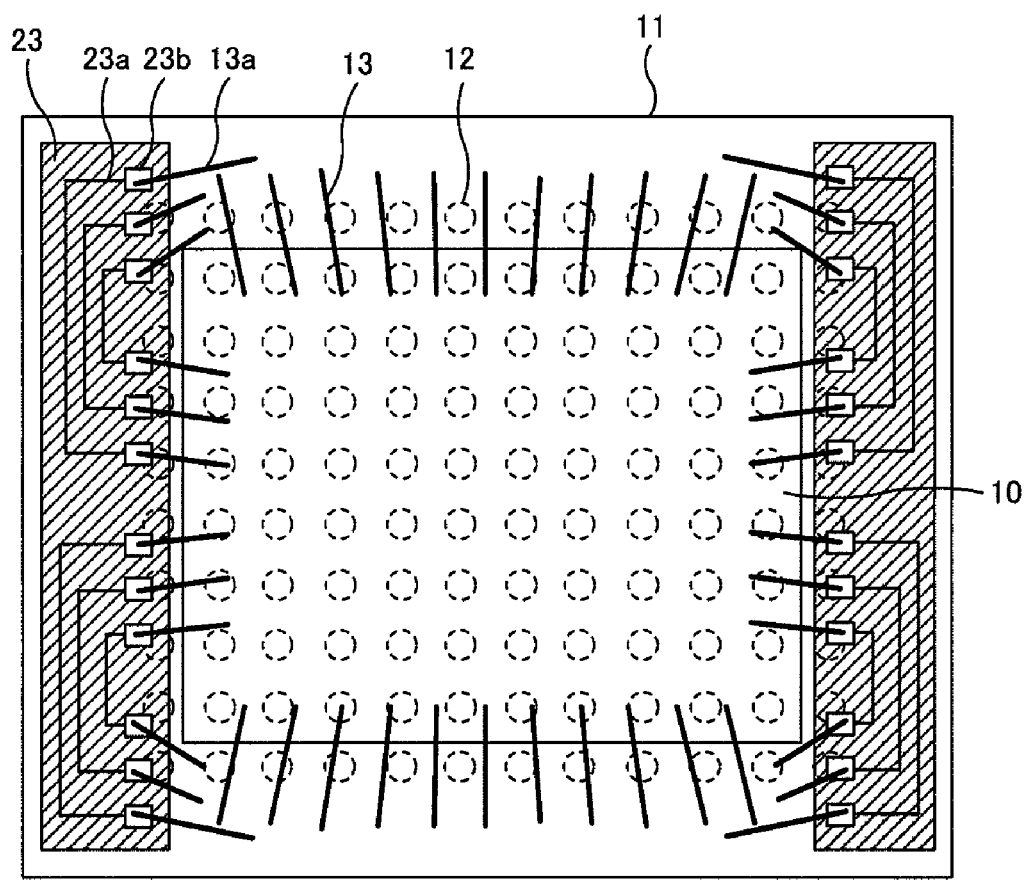
FIG. 8 a plan view of a semiconductor device of a fourth embodiment.

Next, a semiconductor device of a fourth embodiment will be described with reference to FIG. 8. FIG. 8 shows a plan view of the semiconductor device of the fourth embodiment. In the semiconductor device of the fourth embodiment, the basic structure including the semiconductor chip 10 and the package substrate 11 is the same as that in the third embodiment, and additionally two dummy chips 23 having the same shape as the dummy chip 22 of FIG. 7 are arranged. The feature of the fourth embodiment is that a plurality of wiring 23a and a plurality of pads 23b are provided in each dummy chip 23.

In the dummy chip 23 of the fourth embodiment, both ends of each wiring 23a are connected to the pads 23b. Then, one pad 23b is connected to the pad of the semiconductor chip 10 through a wire 13a and the other pad 23b is connected to the connection pad 14 on the package substrate 11 through a wire 13a, for each wiring 23a. This structure enables the pad of the semiconductor chip 10 to be connected to the connection pad 14 through the wire 13a, the pad 23b, the wiring 23a, the pad 23b and the wire 13a in this order. Accordingly, since the fourth embodiment enables rewiring for the semiconductor chip 10 in a state of mounting the dummy chips 23, the number of external terminals can be sufficiently large as well as the effect of suppressing the damage to the bump electrodes 12 as in the third embodiment.

Fifth Embodiment

Figure 9:
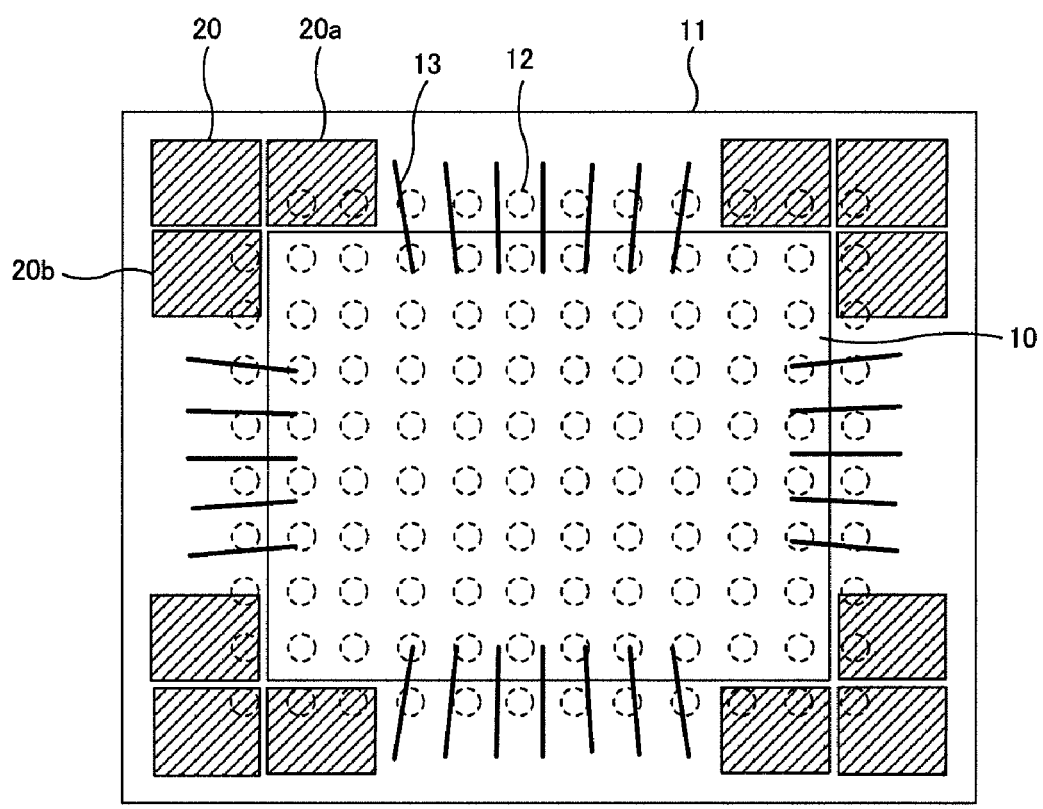
FIG. 9 a plan view of a semiconductor device of a fifth embodiment.
Figure 10:
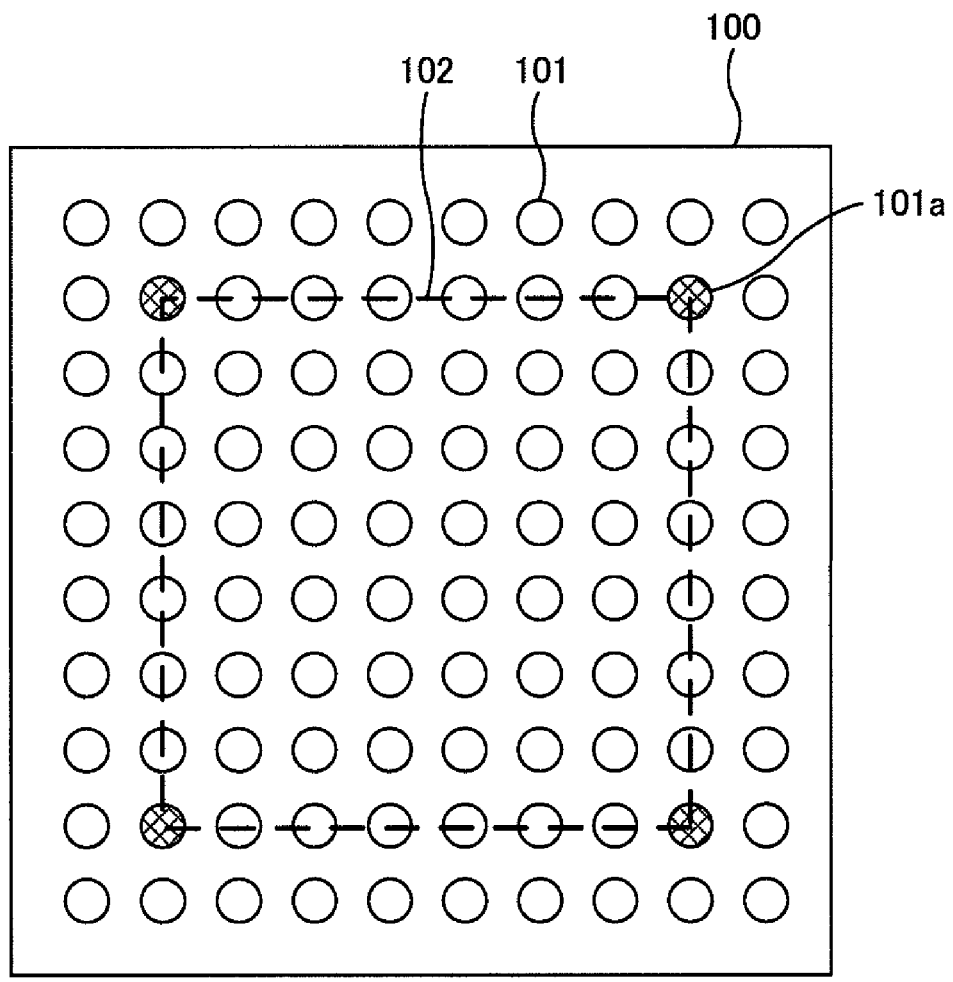
FIG. 10 is a plan view explaining problems related to connection reliability of a conventional semiconductor device.
Figure 11A:
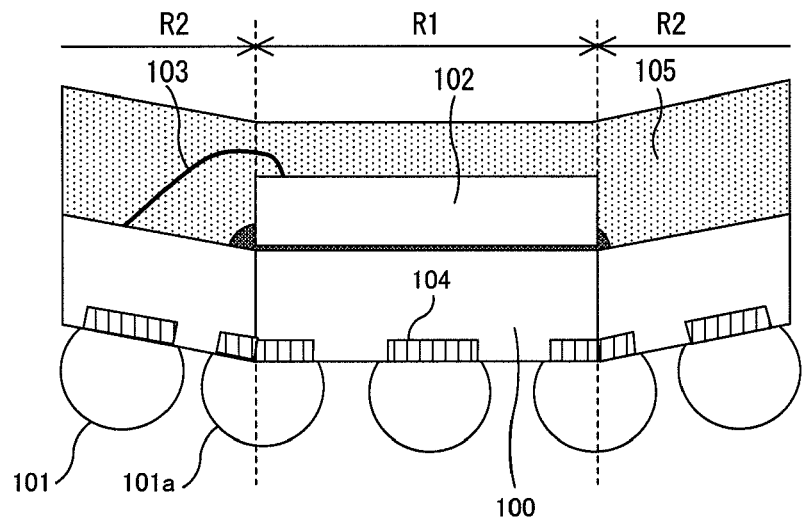
FIGS. 11A and 11B are diagrams schematically showing behaviors of the conventional semiconductor device under temperature fluctuation.
Figure 11B:
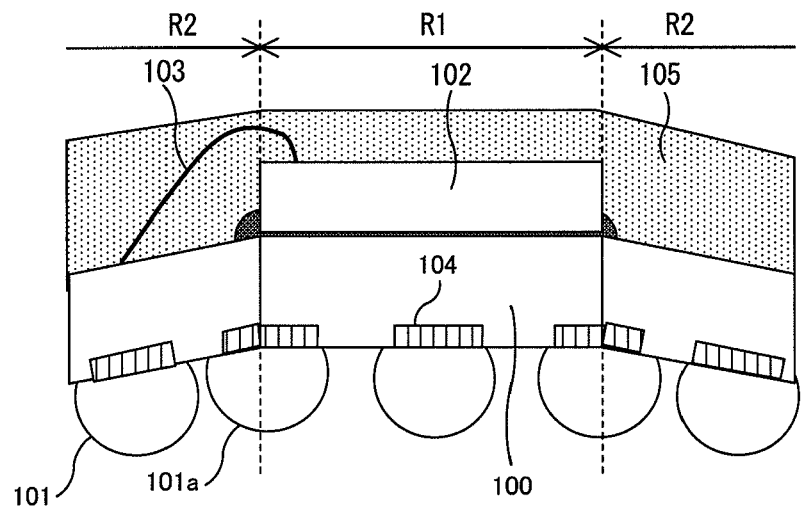

Next, a semiconductor device of a fifth embodiment will be described with reference to FIG. 9. FIG. 9 shows a plan view of the semiconductor device of the fifth embodiment. In the semiconductor device of the fifth embodiment, the basic structure including the semiconductor chip 10 and the package substrate 11 is the same as that in the first embodiment. Meanwhile, the feature of the fifth embodiment is that three dummy chips 20, 20a and 20b are arranged in each region close to each corner portion around the semiconductor chip 10. Among these, the dummy chip 20 has the same arrangement and shape as those in the first embodiment (see FIG. 1), while two dummy chips 20a and 20b adjacent to both sides of the dummy chip 20 are further added.

In the structure of the fifth embodiment, twelve dummy chips 20, 20a and 20b in total are mounted on the peripheral region on the top surface of the package substrate 11. Thereby, since a larger number of the bump electrodes 12 are arranged immediately under the dummy chips 20, 20a and 20b near the four corner portions of the semiconductor chip 10, the damage to the bump electrodes 12 can be suppressed in a wide region so as to improve the connection reliability.

As described above, the present invention has been described based on the first to fifth embodiments, however the present invention can be applied to semiconductor devices having various structures without being limited to the structures in the above embodiments. For example, the package substrate 11 on which the plurality of bump electrodes 12 are formed can be applied to various packages having terminals arranged in a matrix form such as a BGA (Ball Grid Array) package or a PGA (Pin Grid Array) package. Further, the present invention can be applied not only to a single-chip product having one semiconductor chip 10 mounted on the package substrate 11 but also to a chip stack product having a plurality of semiconductor chips 10 stacked on the package substrate 11.

It is apparent that the present invention is not limited to the above embodiments, but may be modified and changed without departing from the scope and spirit of the invention.

What is claimed is:
1. A semiconductor device comprising:
a package substrate;
a semiconductor chip mounted on one surface of said package substrate;
a plurality of bump electrodes mounted on another surface of said package substrate and electrically connected to said semiconductor chip through a wiring structure; and
one or more other chips each mounted on a predetermined region close to a corner portion of said semiconductor chip on the one surface of said package substrate such that deformation of the substrate during temperature fluctuation is limited to prevent fracturing of the bump electrodes, wherein said other chips are formed of material having a same or similar coefficient of thermal expansion as that of said semiconductor chip.

2. The semiconductor device according to claim 1, wherein said other chips are formed with approximately a same thickness as that of said semiconductor chip.

3. The semiconductor device according to claim 1, wherein two said other chips are mounted on two regions along opposite two sides of said semiconductor chip.

4. The semiconductor device according to claim 3, wherein part of a wiring structure for connecting pads of said semiconductor chip to said bump electrodes is formed on each of said other chips.

5. The semiconductor device according to claim 1, further comprising:
an encapsulant made of an insulating resin formed on one surface of the package substrate and further covering the semiconductor chip, the other chip and the wiring structure.

6. The semiconductor device according to claim 5, wherein part of the other chips are exposed from the encapsulant.

7. The semiconductor device according to claim 1, wherein said other chips are silicon chips.

8. The semiconductor device according to claim 1, wherein said other chips are dummy chips.

9. A semiconductor device comprising:
a package substrate;
a semiconductor chip mounted on one surface of said package substrate;
a plurality of bump electrodes mounted on another surface of said package substrate and electrically connected to said semiconductor chip through a wiring structure; and
one or more other chips each mounted on a predetermined region close to a corner portion of said semiconductor chip on the one surface of said package substrate,
wherein said other chips are formed of material having a same or similar coefficient of thermal expansion as that of said semiconductor chip, and
wherein four said other chips are mounted on four regions close to four corner portions of said semiconductor chip.

10. The semiconductor device according to claim 9, wherein said other chips are arranged so that two adjacent sides of each of said other chips overlap two sides of said package substrate.

11. The semiconductor device according to claim 9 wherein other said other chips are mounted on regions adjacent to each of the four said other chips.

12. A semiconductor device comprising:
a package substrate;
a semiconductor chip mounted on one surface of the package substrate;
a plurality of bump electrodes mounted on another surface of the package substrate and electrically connected to the semiconductor chip through a wiring structure; and
one or more other chips each mounted on a predetermined region close to a corner portion of the semiconductor chip such that deformation of the substrate during temperature fluctuation is limited to prevent fracturing of the bump electrodes.

13. The semiconductor device according to claim 12, wherein the one or more other chips are formed approximately the same in thickness as the semiconductor chip.

14. The semiconductor device according to claim 12, wherein first and second other chips are provided as the one or more other chips, the first and second other chips being mounted on two regions respectively along first and second sides of the semiconductor chip which are opposite to each other.

15. The semiconductor device according to claim 14, wherein part of a wiring structure for connecting pads of the semiconductor chip to the bump electrodes is formed on each of the other chips.

16. The semiconductor device according to claim 12, wherein said one or more other chips are each mounted on the predetermined region close to the corner portion of the semiconductor chip such that deformation of the substrate at the corner portion of the semiconductor chip is limited during the temperature fluctuation to prevent the fracturing of the bump electrodes.

17. The semiconductor device according to claim 12, wherein said one or more other chips are each mounted on the predetermined region close to the corner portion of the semiconductor chip such that the deformation of the substrate during the temperature fluctuation is limited to prevent the fracturing of the bump electrodes located at a region of the other surface of the package substrate corresponding to the corner portion of the semiconductor chip.

18. A semiconductor device comprising:
a package substrate;
a semiconductor chip mounted on one surface of the package substrate;
a plurality of bump electrodes mounted on another surface of the package substrate and electrically connected to the semiconductor chip through a wiring structure; and
one or more other chips each mounted on a predetermined region close to a corner portion of the semiconductor chip,
wherein first, second, third and fourth other chips are provided as the one or more other chips, the first to fourth other chips being mounted respectively on four regions close respectively to four corner portions of the semiconductor chip.

19. The semiconductor device according to claim 18, wherein the first, second, third and fourth other chips are arranged so that two adjacent sides of each of the other chips overlap two sides of the package substrate.

20. The semiconductor device according to claim 18, wherein fifth, sixth, seventh, eighth, ninth, tenth, eleventh and twelfth other chips are provided as the one or more other chips,
the fifth and sixth other chips being mounted respectively on two regions close respectively to two adjacent sides of the first other chip, the two adjacent sides facing to the one of the corner portions of the semiconductor chip,
the seventh and eighth other chips being mounted respectively on two regions close respectively to two adjacent sides of the second other chip, the two adjacent sides facing to the one of the corner portions of the semiconductor chip,
the ninth and tenth other chips being mounted respectively on two regions close respectively to two adjacent sides of the third other chip, the two adjacent sides facing to the one of the corner portions of the semiconductor chip, and
the eleventh and twelfth other chips being mounted respectively on two regions close respectively to two adjacent sides of the fourth other chip, the two adjacent sides facing to the one of the corner portions of the semiconductor chip.

* * * * *